US 6,549,554 B2

(12) United States Patent
Shiojima et al.

(10) Patent No.: US 6,549,554 B2
(45) Date of Patent: Apr. 15, 2003

(54) SEMICONDUCTOR LASER ELEMENT, SEMICONDUCTOR ETCHANT, AND METHOD OF FABRICATING THE SEMICONDUCTOR LASER ELEMENT

(75) Inventors: Takeshi Shiojima, Tokyo (JP); Keiichi Yabusaki, Tokyo (JP); Michio Ohkubo, Tokyo (JP)

(73) Assignee: The Furukawa Electric Co., LTD, Tokyo (JP)

( * ) Notice: Subject to any disclaimer, the term of this patent is extended or adjusted under 35 U.S.C. 154(b) by 145 days.

(21) Appl. No.: 09/852,710

(22) Filed: May 11, 2001

(65) Prior Publication Data

US 2001/0038654 A1 Nov. 8, 2001

(30) Foreign Application Priority Data

May 11, 2000 (JP) .................................... 2000-139012
May 7, 2001 (JP) .................................... 2001-136670

(51) Int. Cl.$^7$ ................................................ H01S 3/19
(52) U.S. Cl. .......................... 372/46; 372/42; 257/99; 257/101
(58) Field of Search ............................ 372/46, 43, 45; 257/94, 99, 101

(56) References Cited

U.S. PATENT DOCUMENTS

| | | | |
|---|---|---|---|
| 5,375,137 A | * 12/1994 | Hirayama et al. | ............. 372/46 |
| 5,815,522 A | * 9/1998 | Nagai | ............................ 372/46 |
| 5,994,723 A | * 11/1999 | Sekii et al. | .................... 257/99 |
| 6,444,998 B1 | * 9/2002 | Taniguchi et al. | ............. 257/99 |

FOREIGN PATENT DOCUMENTS

| JP | 06-188511 | 7/1994 |
|---|---|---|
| JP | 07-007004 | 1/1995 |

* cited by examiner

*Primary Examiner*—Albert W. Paladini
(74) *Attorney, Agent, or Firm*—Oblon, Spivak, McClelland, Maier & Neustadt, P.C.

(57) ABSTRACT

The semiconductor laser element comprises, from bottom to top, the p-$Al_xGa_{1-x}$As upper clad layer, p-$Al_yGa_{1-y}$As resistance control layer, and p-GaAs cap layer (where x>y>0.2). A portion of only the resistance control layer and cap layer is selectively etched. The etchant used for this etching is a mixture of organic acid and hydrogen peroxide based mixture, has such a composition such that the ratio of dissolution rate of the upper clad layer to the cap layer is between 10 and 20, and pH is between 7.4 and 7.6.

34 Claims, 12 Drawing Sheets

FIG.6

| | NFP SIZE | Δlop |
|---|---|---|
| EMBODIMENTS 1,2 | 6 μm | 1% |
| ANOTHER EXAMPLE OF EMBODIMENTS 1,2 | 6 μm | 1% |
| CONVENTIONAL EXAMPLE | 3 μm | 10% |

SEMICONDUCTOR LASER ELEMENT, SEMICONDUCTOR ETCHANT, AND METHOD OF FABRICATING THE SEMICONDUCTOR LASER ELEMENT

FIELD OF THE INVENTION

The present invention relates to a semiconductor laser element having a current non-injection region. This invention also relates to a semiconductor etchant ("etchant") used for selectively etching a compound semiconductor crystal, and a method of fabricating the semiconductor laser element using the semiconductor etchant.

BACKGROUND OF THE INVENTION

GaAs-based semiconductor laser elements are widely used in excitation light sources of optical amplifiers and the like. When the GaAs-based semiconductor laser element is used in excitation light sources, it is necessary that its light output is high. However, when the light output of the semiconductor laser element is increased, following phenomenon disadvantageously occur at the laser end facet of the semiconductor laser element. Firstly there occurs an optical damage, secondly there occurs a corrosion of the laser end facet when the laser element is operated over a long period. It is believed that these phenomenon are caused because of increase of the temperature of the end facet (resonator surface), contraction of the band gap, photoabsorption, recombination current, and a combination of one or more of these.

When the light output of the semiconductor laser element is increased, the optical damage and end facet corrosion become more conspicuous because the light density at the end facet increases. Sometimes the deterioration is so high that the generation of laser is suddenly stopped. In order to overcome these problems, it is desirable to have a semiconductor laser element in which light intensity is reduced only near the end facet.

As a countermeasure, Japanese Patent Application Laid-Open No. 6-188511 discloses a semiconductor laser element which has resonator end facets with different reflectances, and a ridge mesa on an active layer. The ridge mesa is formed in the region except in a region near the resonator end facet on the low reflectance side. At least a part of the region where the ridge mesa is formed is provided with a current non-injection structure.

A cross-section of the semiconductor laser element proposed in the above-mentioned reference is shown in FIG. 9. A cross section of the semiconductor laser element along the line A—A shown in FIG. 9 is shown in FIG. 10. This semiconductor laser element is fabricated by the following method.

1) An epi-wafer is fabricated by stacking a plurality of layer on n-GaAs substrate 1. In this epi-wafer, n-GaAs ($n=1\times10^{18}$ $cm^{-3}$) buffer layer 2 of thickness 0.5 $\mu$m, n-AlGaAs ($n=1\times10^{18}$ $cm^{-3}$) lower clad layer 3 of thickness 1.5 $\mu$m, n-GaAs ($n=3\times10^{17}$ $cm^{-3}$) lower optical confinement layer 4 of thickness 0.03 $\mu$m, p-$In_{0.2}Ga_{0.8}As$ ($p=3\times10^{17}$ $cm^{-3}$) active layer 5 of thickness 80 Å, p-GaAs ($p=3\times10^{17}$ $cm^{-3}$) upper optical confinement layer 6 of thickness 0.03 $\mu$m, p-$Al_{0.35}Ga_{0.65}As$ ($p=1\times10^{18}$ $cm^{-3}$) upper clad layer 7 of thickness 1.2 $\mu$m, and p-GaAs ($p=4\times10^{19}$ $cm^{-3}$) cap layer 9 of thickness 0.5 $\mu$m are successively stacked on the n-GaAs substrate 1.

2) A ridge mesa having a width of about 2 to 3 $\mu$m and length of about 800 $\mu$m is created on the epi-wafer using photolithography technique. As a result, length of the cavity of this semiconductor laser element becomes 800 $\mu$m.

3) The cap layer 9 from the anti-reflection side end facet, that is, from the laser-emission side end facet F1 is to a width of 25 $\mu$m is removed by selective etching to obtain the current non-injection structure. The reference numeral F2 denotes the laser-reflection side end facet.

The cap layer may be removed using the semiconductor etchant disclosed, for example, in Japanese Patent Application Laid-Open No. 7-7004. This reference discloses an etchant that selectively etches only the GaAs layer when there exists layers of GaAs and AlGaAs. This method is therefore called selective etching. The etchant is prepared by adding a basic compound to a mixture of organic acid and hydrogen peroxide based mixture in such a manner that the pH of the mixture is between 6.0 and 8.0. The organic acid is, for example, citric acid.

Precisely, aqueous citric acid solution (1% by weight) and aqueous solution of hydrogen peroxide solution (30% by weight) are mixed at a volume ratio of 100:1. Ammonia is added to this mixture in such a manner that the pH of the mixture is between 6.0 and 8.0. Assume that the ratio of the etching rate of the p-GaAs cap layer 9 to that of the p-$Al_{0.35}Ga_{0.65}As$ upper clad layer 7 is called as selection ratio. Then, the p-GaAs cap layer 9 is etched more effectively when the selection ratio is high and etching can be stopped exactly at the p-$Al_{0.35}Ga_{0.65}As$ upper clad layer 7. Based on an experiment it was confirmed that the selection ratio is 85 when the pH of the etchant is 7.0. In an another experiment the p-GaAs cap layer 9 was removed using the etchant having the pH 7.0.

4) Both the surfaces of the ridge mesa were then covered with the SiN film 10. Finally, p-electrode 11 and n-electrode 12 are stacked to have the semiconductor laser element. This semiconductor laser element is also called a ridge waveguide type semiconductor laser element.

FIG. 11 shows a cross of another conventional semiconductor laser element. The difference between the semiconductor laser element shown in FIG. 11 and that shown in FIG. 9 is that the semiconductor laser element shown in FIG. 11 has p-$Al_{0.15}Ga_{0.85}As$ resistance control layer 8 formed between the p-GaAs cap layer 9 and the p-$Al_{0.35}Ga_{0.65}As$ upper clad layer 7. It is known that the resistivity of the p-GaAs cap layer 9 can be reduced by employing such a structure. FIG. 12 shows a cross section of the semiconductor laser element along the line A-A shown in FIG. 11. The current non-injection structure is formed by selectively etching a region from the laser-emission side end facet of the cap layer 9 and the resistance control layer 8. The width of this removed region is 25 $\mu$m. In other words, in this semiconductor laser element it is necessary to etch both the p-GaAs cap layer 9 and the p-$Al_{0.15}Ga_{0.85}As$ resistance control layer 8 in one etching.

However, when both the p-GaAs cap layer 9 and the p-$Al_yGa_{1-y}As$ layer 8 are to be removed by one etching, depending on the composition ratio y of aluminum, a small portion of p-$Al_yGa_{1-y}As$ resistance control layer 8 is disadvantageously leftover as it is without being etched.

If even a small portion of the p-$Al_yGa_{1-y}As$ resistance control layer 8 remains then the end facet corrosion occurs when the laser output is increased. FIG. 11 and FIG. 12 show a portion 8a, of the layer 8, that remained above the upper clad layer 7 because of incomplete etching. When this portion 8a remains above the upper clad layer 7, which is a current non-injection layer, injection current flows into the laser-emission side end facet of the active layer 5 through this non-etched region 8a. When current flows in the active layer 5, the above-mentioned cycle of positive feedback occurs, and optical damage and end facet corrosion occur at the laser-emission side end facet.

Thus, with the conventional technology, it is possible to effectively etch only the GaAs layer when there are layers of GaAs and AlGaAs. However, it is almost impossible to completely etch the p-GaAs layer and the p-$Al_yGa_{1-y}As$ layer in one etching when there are layers of p-GaAs, p-$Al_yGa_{1-y}As$, and p-$Al_xGa_{1-x}As$.

SUMMARY OF THE INVENTION

It is an object of the present invention to provide a semiconductor laser element having an improved current non-injection structure. It is another aspect of this invention to provide an etchant which can selectively and completely etch desired layers in one etching without harming the other layers. It is still another aspect of this invention to provide a method of fabricating the semiconductor laser element according to the present invention using the etchant according to the present invention.

According to the semiconductor laser element of one aspect of this invention, desired layers are completely etched without harming other layers. Furthermore, an insulating layer that has substantially the same thickness as the thickness of the etched layers is formed in the portion from where the layers are etched. The layers may be etched only near the laser-emission side end facet, or maybe etched near both the laser-emission side end facet and the laser-reflection side end facet.

According to the semiconductor laser element of another aspect of this invention, desired layers are completely etched without harming other layers. Furthermore, an insulating layer that covers only the surfaces of the layers that were exposed due to the etching is formed.

According to the etchant of still another aspect of this invention, when there are first, second, and third layers from top to bottom in order in a semiconductor laser element, then an etchant for which the ratio of dissolution rates of the first semiconductor layer to the third semiconductor layer is between 10 and 20 is used.

Other objects and features of this invention will become apparent from the following description with reference to the accompanying drawings.

BRIEF DESCRIPTION OF THE DRAWINGS

FIG. 6 is a table that shows a comparison between the semiconductor laser elements formed using the etchant according to the first and second embodiments and the semiconductor laser element formed using the conventional etchant.

DESCRIPTION OF THE PREFERRED EMBODIMENTS

Three embodiments of the present invention will be explained in detail below with reference to the accompanying drawings. However, this invention should by no means limited to these embodiments.

Figure 1:
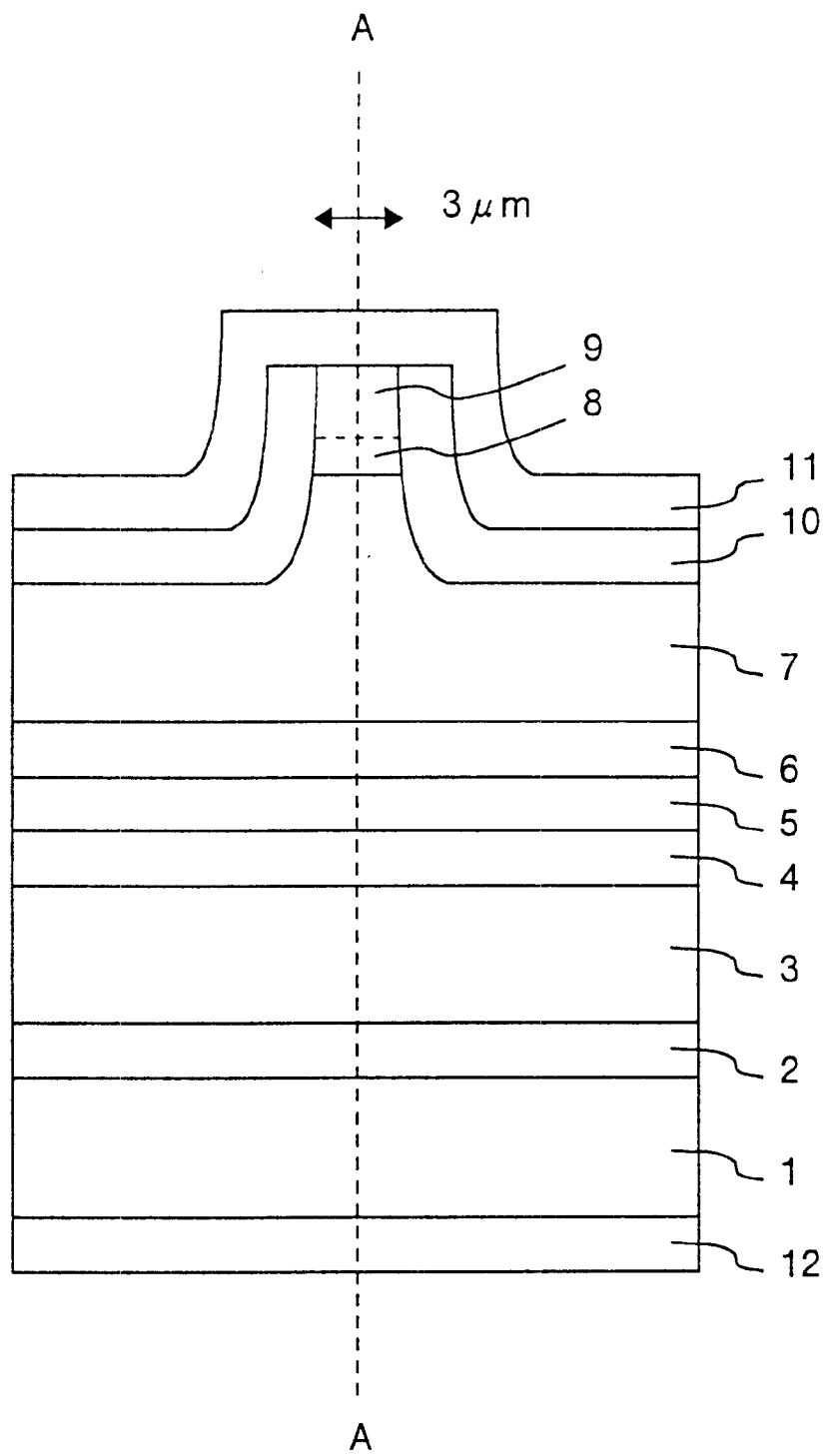
FIG. 1 shows a cross section of a semiconductor laser element according to a first embodiment of this invention.
Figure 2:
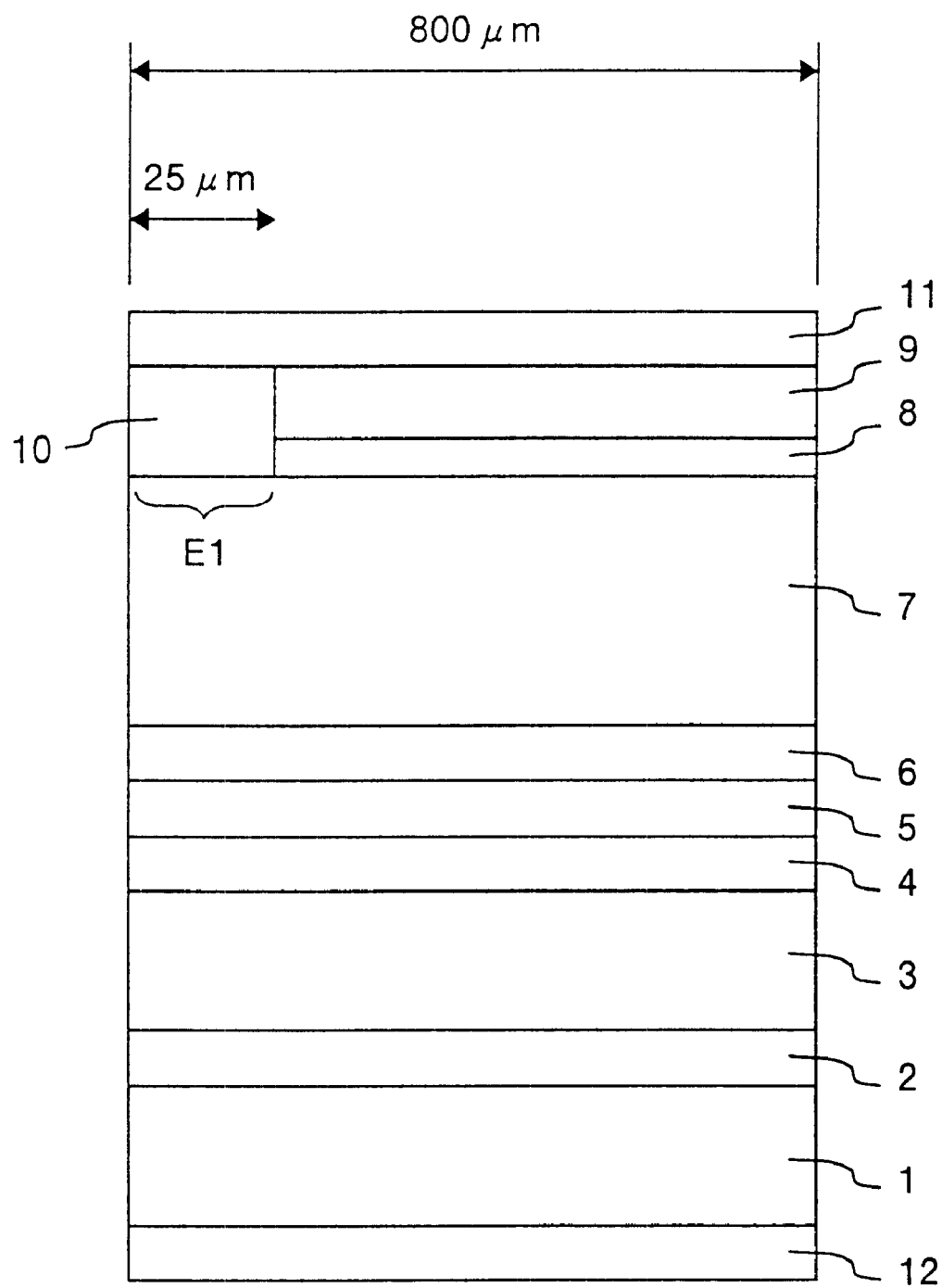
FIG. 2 shows a cross section of the semiconductor laser element shown FIG. 1 along the line A—A.

A cross of the semiconductor laser element according to a first embodiment of this invention is shown in FIG. 1. A cross section of the semiconductor laser element shown in FIG. 1 along the line A—A is shown in FIG. 2. The semiconductor laser element according to the first embodiment is fabricated in the manner as shown in FIG. 3A to FIG. 3D.

Figure 11:
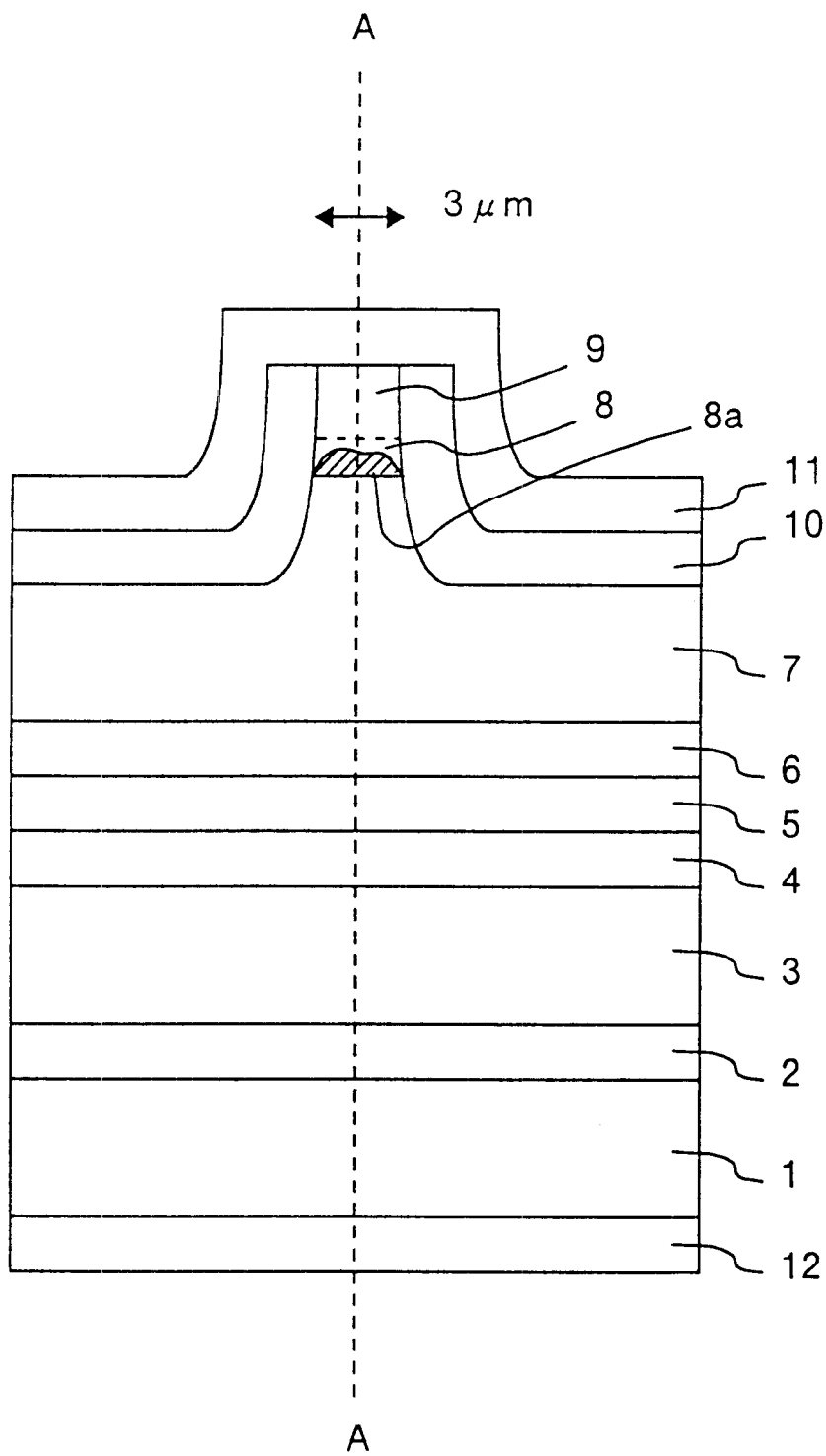
FIG. 11 shows a cross section of another conventional semiconductor laser element which has a resistance control layer.
Figure 12:
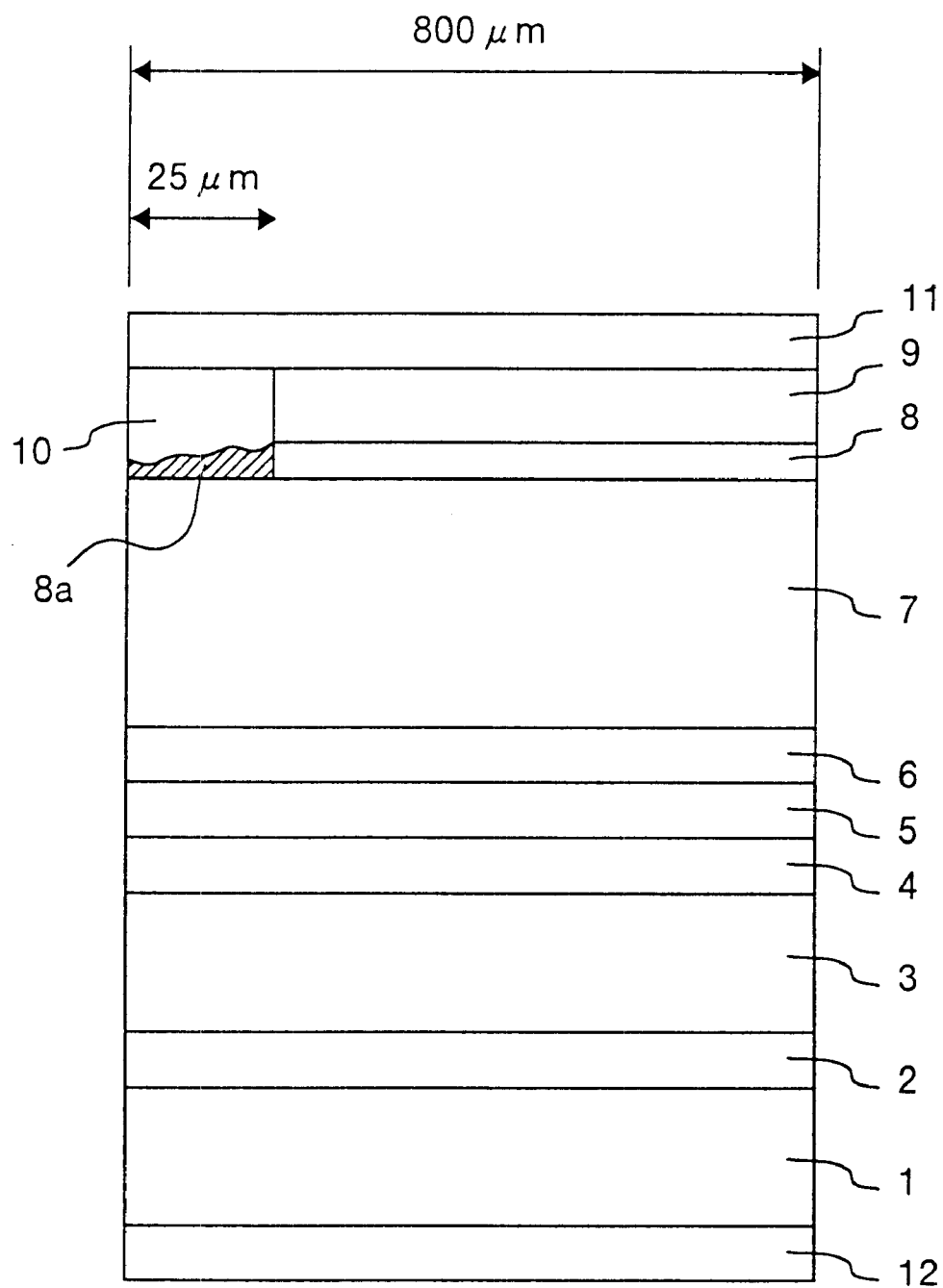
FIG. 12 shows a cross section of the semiconductor laser element shown in FIG. 11 along the line A—A.

The semiconductor laser element according to the first embodiment has the same structure as that of the conventional semiconductor laser element shown in FIG. 11 and FIG. 12. The difference between the two is that, current non-injection structure can surely be formed in the semiconductor laser element according to the first embodiment. This has become possible because of the use of an etchant according to this invention which completely etches the desired layers.

The semiconductor laser element according to the first embodiment is fabricated in the manner explained below. To begin with, as shown in FIG. 1 and FIG. 2, the n-GaAs substrate 1 is formed. Then, the n-GaAs (n=$1 \times 10^{18}$ cm$^{-3}$) buffer layer 2 of thickness 0.5 μm, n-AlGaAs (n=$1 \times 10^{18}$ cm$^{-3}$) lower clad layer 3 of thickness 1.5 μm, n-GaAs (n=$3 \times 10^{17}$ cm$^{-3}$) lower optical confinement layer 4 of thickness 0.03 μm, p-$In_{0.2}Ga_{0.8}As$ (p=$3 \times 10^{17}$ cm$^{-3}$) active layer 5 of thickness 80 Å, p-GaAs (p=$3 \times 10^{17}$ cm$^{-3}$) upper optical confinement layer 6 of thickness 0.03 μm, and p-$Al_{0.35}Ga_{0.65}As$ (p=$1 \times 10^{18}$ cm$^{-3}$) upper clad layer 7 of thickness 1.2 μm are successively stacked above the n-GaAs substrate 1.

Figure 3A:
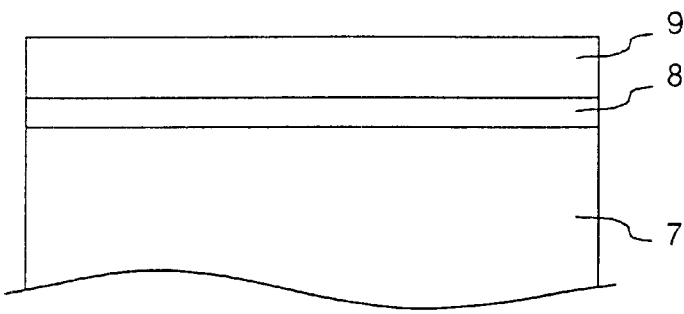
FIG. 3A to FIG. 3D show how the semiconductor laser element shown in FIG. 1 is fabricated.
Figure 3B:
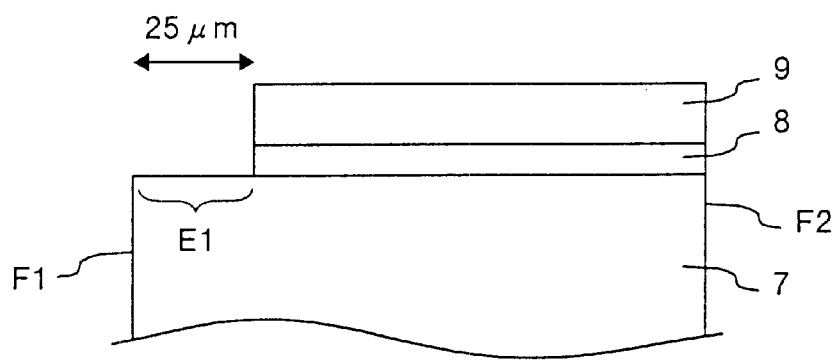

Subsequently, as shown in FIG. 3A in more detail, the p-$Al_{0.15}Ga_{0.85}As$ resistance control layer 8 of thickness 0.5 μm and the p-GaAs (p=$4 \times 10^{19}$ cm$^{-3}$) cap layer 9 of thickness 0.03 μm are successively stacked above the upper clad layer 7. Then, as shown in FIG. 3B, a portion of the cap layer 9 and resistance control layer 8 beginning form the laser-emission side end facet F1 is completely removed using an etchant. The width of the etched portion is 25 μm. As a result, top surface of the upper clad layer 7 in a portion E near the laser-emission side end facet F1 is exposed. The reference symbol F2 denotes the laser-reflection side end facet.

Figure 3C:
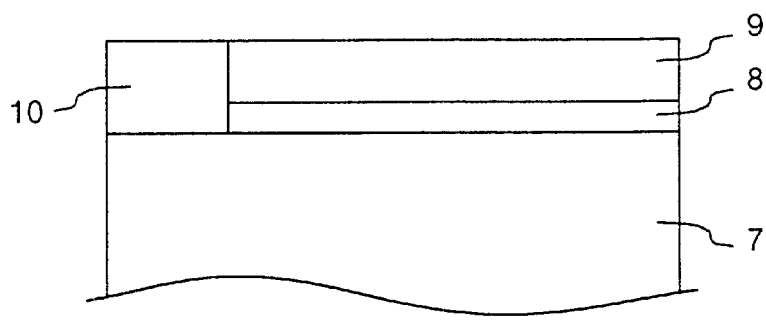
Figure 3D:
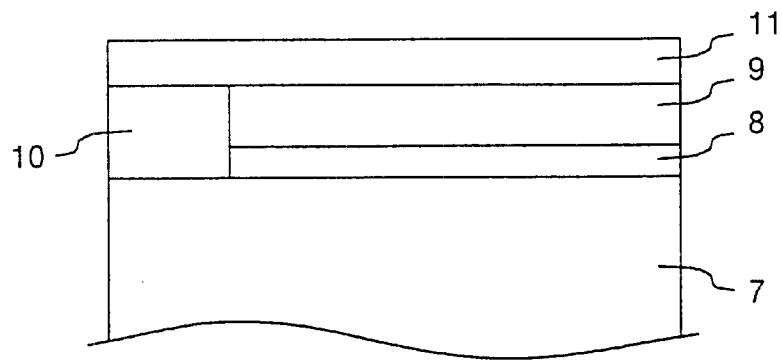

Thereafter, as shown in FIG. 3C, SiN film 10 is formed in the portion from where the cap layer 9 and the resistance control layer 8 were removed. At this time, the upper clad layer 7, the resistance control layer 8, and the cap layer 9 are etched into a mesa stripe, and the SiN film 10 is also formed around the periphery of the etched area. Then, the p-electrode 11 and n-electrode 12 are formed to have the ridge waveguide type semiconductor laser element. Finally, a coating of an anti-reflection film is created on the laser-emission side end facet F1, and a coating of optical reflection film is created on the laser-reflection side end facet F2.

The etchant used for selectively etching the cap layer 9 and resistance control layer 8 is prepared as follows. Aqueous citric acid solution (1% by weight) and aqueous hydrogen peroxide solution (30% by weight) are mixed in a volume ratio of 100:1. The pH of this mixture is adjusted to be 7.5 by adding ammonia to the mixture. The selection ration, i.e. the ratio of the etching rate of the p-GaAs layer to that of the p-Al$_{0.35}$Ga$_{0.65}$As layer, is about 18 in this case. The obtained etchant will be referred to as etchant T1. The etchant T1 is used to selectively etch only the p-GaAs cap layer 9 and p-Al$_{0.15}$Ga$_{0.85}$As resistance control layer 8 without harming the p-Al$_{0.35}$Ga$_{0.65}$As upper clad layer 7. The p-Al$_{0.15}$Ga$_{0.85}$As resistance control layer 8 is completely removed in this etching.

The etchant is not limited to the one described above. Another etchant will be explained here. This etchant is obtained by mixing aqueous citric acid solution (1% by weight) and aqueous hydrogen peroxide solution (30% by weight) in a volume ratio of 100:1. The pH of this mixture is adjusted to be 6.0 by adding ammonia to the mixture. The selection ratio in this case is about 10. The obtained etchant will be referred to as etchant T2.

The relation between the pH of the etchant and the selection ratio will be explained below with reference to FIG. 4. After numerous experiments, it was confirmed that the p-GaAs cap layer 9 and the p-Al$_y$Ga$_{1-y}$As resistance control layer 8 can be completely etched and the p-Al$_x$Ga$_{1-x}$As upper clad layer 7 remains unharmed when the selection ratio is between 10 and 20. From FIG. 4 it can be seen that, the selection ratio will be between 10 and 20 when the pH of the etchant is between 6.0 to 6.1 or between 7.4 to 7.6. The selection ratio to pH curve is steeper when the pH is between 6.0 and 6.1. The selection ratio to pH curve is gentle when the pH is between 7.4 and 7.6. This means that, stable and effective etching can be performed when the pH of the etchant is between 7.4 to 7.6. Therefore, the pH of the etchant should preferably be between 7.4 and 7.6. However, better results will be obtained when the pH is between 7.4 and 7.8.

According to the first embodiment, the pH of citric acid based etchant is set between 6.0 to 6.1 or between 7.4 to 7.6 and this etchant is used for the selective etching to obtain the semiconductor laser element. As a result, only the p-GaAs cap layer 9 and p-Al$_{0.5}$Ga$_{0.85}$As resistance control layer 8 are effectively etched without harming the p-Al$_{0.35}$Ga$_{0.65}$As upper clad layer 7. The obtained semiconductor laser element has an advantage that the light output is high, intensity of light is low near the end facet, and there is the p-Al$_y$Ga$_{1-y}$As layer which reduces resistivity of the p-GaAs layer. Better results are achieved when the pH of the etchant is between 7.4 to 7.6.

In the first embodiment, a case is described in which the current non-injection structure is formed only on the laser-emission side end facet F1. However, the current non-injection structure may be formed on both the laser-emission side end facet F1 and the laser-reflection side end facet F2. When the current non-injection structure is formed on the laser-reflection side end facet F2, optical damage or end facet corrosion that may occur at the laser-reflection side end facet F2 can reliably be prevented. A case in which the current non-injection structure is formed on both the laser-emission side end facet F1 and the laser-reflection side end facet F2 will be explained as a second embodiment.

Figure 5:
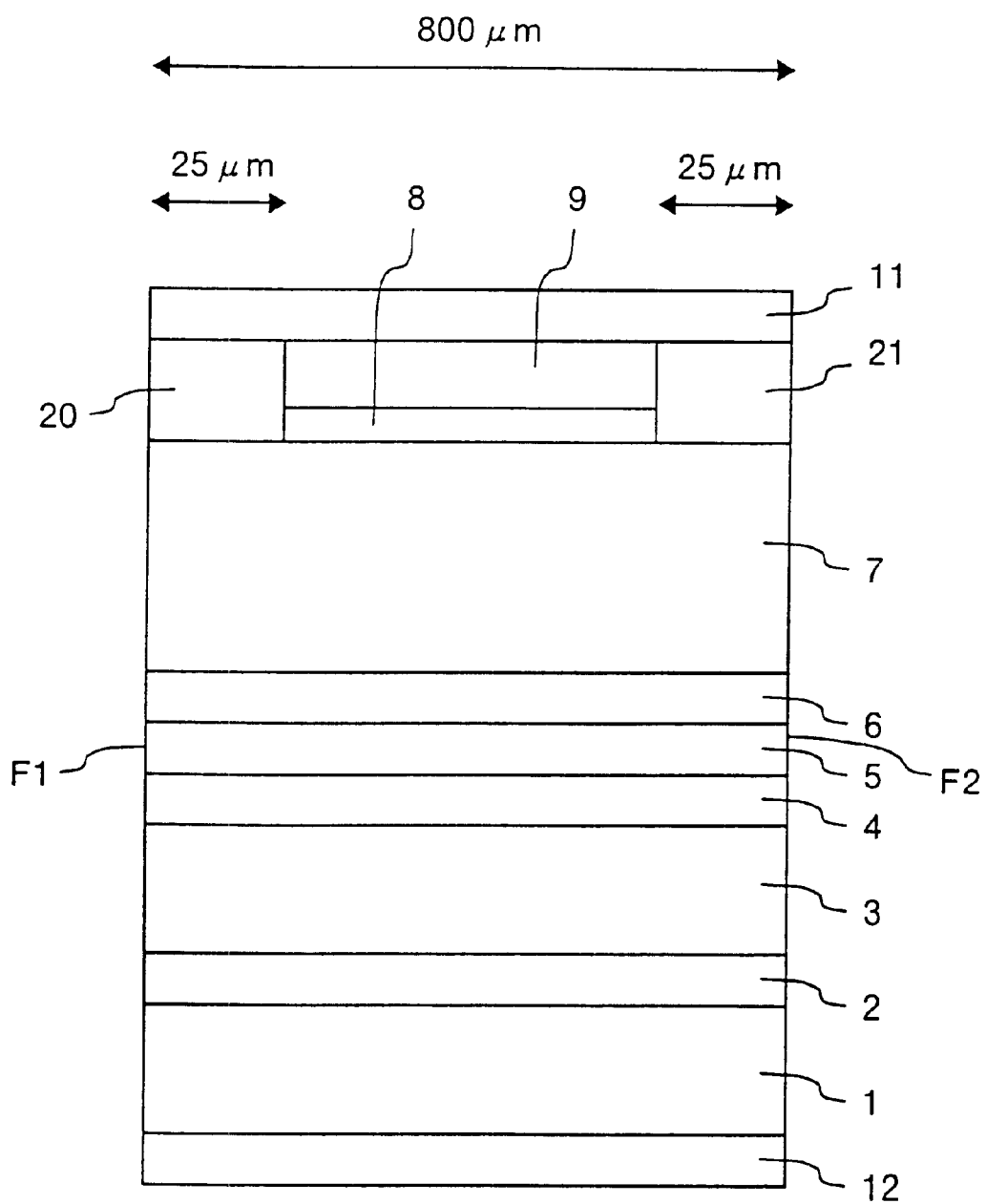
FIG. 5 shows a cross section of a semiconductor laser element according to a second embodiment of this invention.

FIG. 5 shows a cross section of the semiconductor laser element according to the second embodiment. SiO$_2$ film 20 as insulating film is provided near the laser-emission side end facet F1. Similarly, SiO$_2$ film 21 as insulating film is provided near the laser-reflection side end facet F2. The insulating SiO$_2$ films 20 and 21 correspond to the SiN film in the first embodiment. In other words, current non-injection structure is provided on both the laser-emission side end facet F1 and the laser-reflection side end facet F2. The depth of the current non-injection structure from the respective end facet is 25 μm.

The etchant used for selectively etching the cap layer 9 and resistance control layer 8 is prepared as follows. Ammonia is mixed with aqueous citric acid solution (1% by weight) to adjust the pH to 7.4. Then this mixture and aqueous hydrogen peroxide solution (30% by weight) are mixed in a volume ratio of 50:1. The pH of the resultant mixture is adjusted to be 7.4. The selection ratio in this case is about 15. The obtained etchant will be referred to as etchant T3.

The etchant T3 is used to selectively etch only the p-GaAs cap layer 9 and p-Al$_{0.15}$Ga$_{0.85}$As resistance control layer 8 without harming the p-Al$_{0.35}$Ga$_{0.65}$As upper clad layer 7. The p-Al$_{0.15}$Ga$_{0.85}$As resistance control layer 8 was completely removed in this etching.

Then, the p-electrode 11 and n-electrode 12 are formed in the manner as already explained in the first embodiment. Finally, a coating of an anti-reflection film is created on the laser-emission side end facet F1, and a coating of optical reflection film is created on the laser-reflection side end facet F2 in the manner as already explained in the first embodiment.

The etchant is not limited to the one described above. Another etchant will be explained here. Ammonia is mixed with aqueous citric acid solution (1% by weight) to adjust the pH to 6.1. Then this mixture and aqueous hydrogen peroxide solution (30% by weight) are mixed in a volume ratio of 50:1. The pH of the resultant mixture is adjusted to be 6.1. The selection ratio in this case is about 15. The obtained etchant will be referred to as etchant T4.

The result of comparison between the etchants T1 and T2 used in the first embodiment, etchants T3 and T4 used in the second embodiment, and the conventional etchant will be explained below with reference to FIG. 6. Just for reference, the pH of the conventional etchant is 7.0 and the selection ratio is 85.

Semiconductor laser elements were formed using the etchants T1, T2, T3, T4, and conventional etchant. Horizontal size of near-field pattern (NFP), and the rise ratio ($\Delta I_{op}$) of threshold current after the reliability test at 100 mW, 50° C. for 1000 hours of these semiconductor laser elements were measured. The results are shown in FIG. 6.

The NFP size of the semiconductor laser elements obtained by using the etchants T1, T2, T3, T4 according to the present invention is broader than that of the semiconductor laser elements obtained by using the conventional etchant. Moreover, the rise ratio $\Delta I_{op}$ of the threshold current is less in the semiconductor laser elements according to the present invention than that in the conventional semiconductor laser element. This means that the light intensity near the laser-emission side end facet F1 of the semiconductor laser elements according to the present invention is less than that of the conventional semiconductor laser element. In other words, there will be less deterioration of the end facet of the semiconductor laser elements according to the present invention than that of the conventional semiconductor laser element.

In the first and second embodiments a case is explained in which an insulating film is filled in the portion from where the layers were removed by etching. However, the portion from where the layers were removed by etching may be covered (coated) with an insulating. This case will be described below as a third embodiment.

Figure 7:
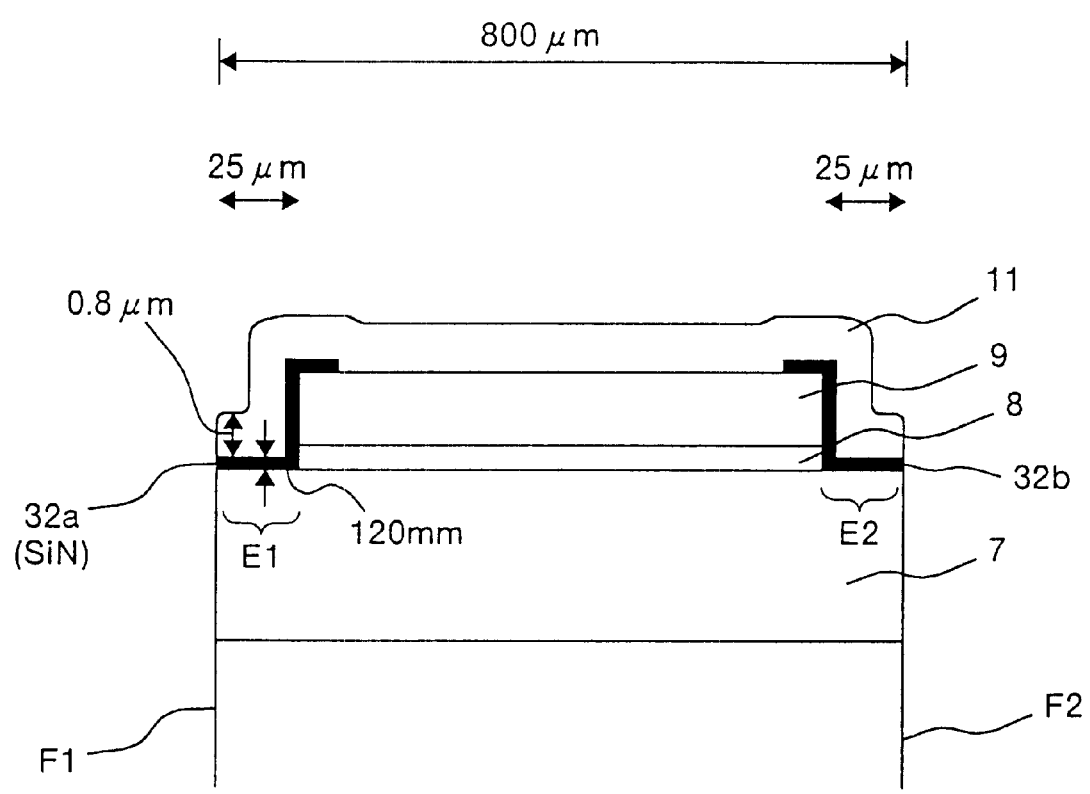
FIG. 7 shows a cross section of a semiconductor laser element according to a third embodiment.

Cross section of the semiconductor laser element according to the third embodiment is shown in FIG. 7. The number and composition of the layers below the layer 7 shown in FIG. 7 is the same as those shown in FIG. 1 or FIG. 5, therefore, their explanation will be omitted to avoid simple repetition of explanation.

The differences between the semiconductor laser element shown in FIG. 7 and that shown in FIG. 5 are as follows. Insulating SiN films 32a and 32b are provided instead of the insulating $SiO_2$ films 20 and 21. The SIN films 32a and 32b cover the surface of the lower clad layer 7 that is exposed because of etching. Furthermore, the p-electrode 11 covers the SiN films 32a and 32b and the cap layer 9.

Thus, current non-injection structure is provided on both the laser-emission side end facet F1 and the laser-reflection side end facet F2. The depth of the current non-injection structure from the respective end facet is 25 µm.

Figure 8A:
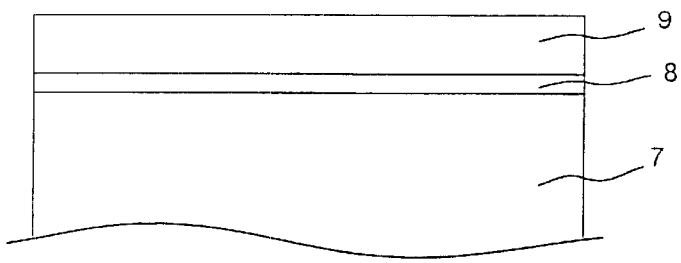
FIG. 8A to FIG. 8D show how the semiconductor laser element shown in FIG. 7 is fabricated.

The semiconductor laser element according to the third embodiment is fabricated in the manner as shown in FIG. 8A to FIG. 8D. The layers from the n-GaAs substrate 1 to the p-$Al_{0.35}Ga_{0.65}As$ upper clad layer 7 are stacked in the same manner as explained in the first embodiment. Subsequently, as shown in FIG. 8A, p-$Al_{0.15}Ga_{0.85}As$ resistance control layer 8 of thickness 0.5 µm and the p-GaAs (p=4×10$^{19}$ cm$^{-3}$) cap layer 9 of thickness 0.03 µm are successively stacked on the upper clad layer 7.

Figure 8B:
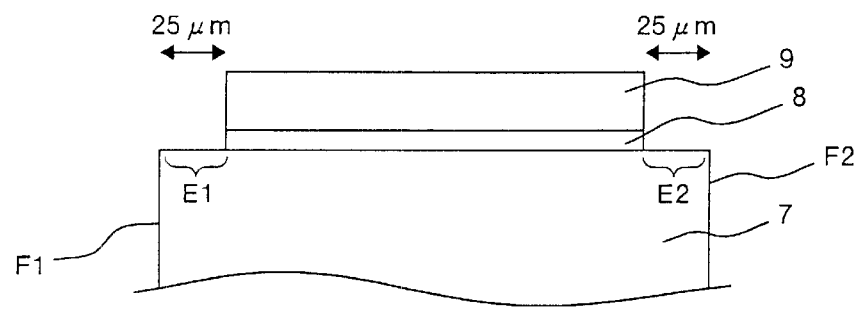
Figure 8C:
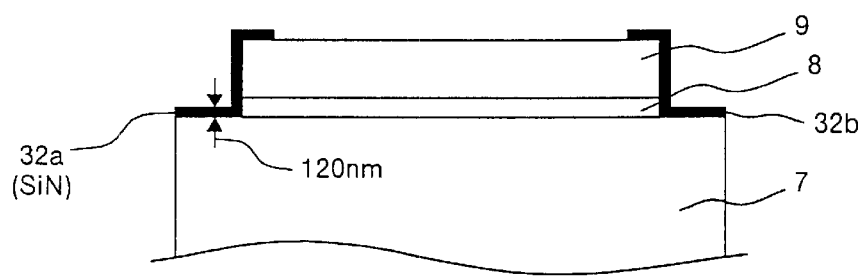

Moreover, as shown in FIG. 8B, portions of the cap layer 9 and resistance control layer 8 beginning form the laser-emission side end facet F1 and the laser-reflection side end facet F2 are completely removed using an etchant. The width of the removed portion from each end facet is 25 µm. As a result, portions shown by reference numerals E1 and E2 of the upper clad layer 7 are exposed through removal of the resistance control layer 8 near the laser-emission side end facet F1 and the laser-reflection side end facet F2 are exposed. Thereafter, as shown in FIG. 8C, the insulating SiN films 32a and 32b of thickness 120 nm are deposited in such a manner that these insulating films cover the exposed portions of the upper clad layer 7, the sides of the cap layer 9 and resistance control layer 8, and a small portion of the top surface of the cap layer 9. At this time, the upper clad layer 7, the resistance control layer 8, and the cap layer 9 are etched into a mesa stripe, and the SiN films 32a and 32b are also formed around the periphery of the etched area. The thickness of the insulating SiN films 32a and 32b is not limited only to 120 nm. The thickness should preferably be 100 nm or more. If the thickness is less than 100 nm then IL characteristics degrade.

Figure 8D:
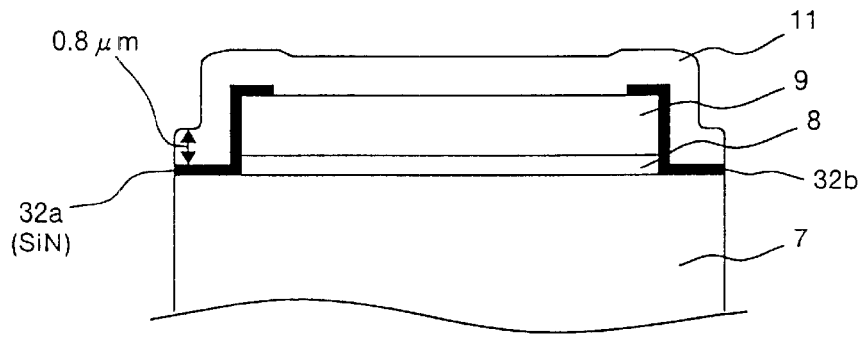
Figure 9:
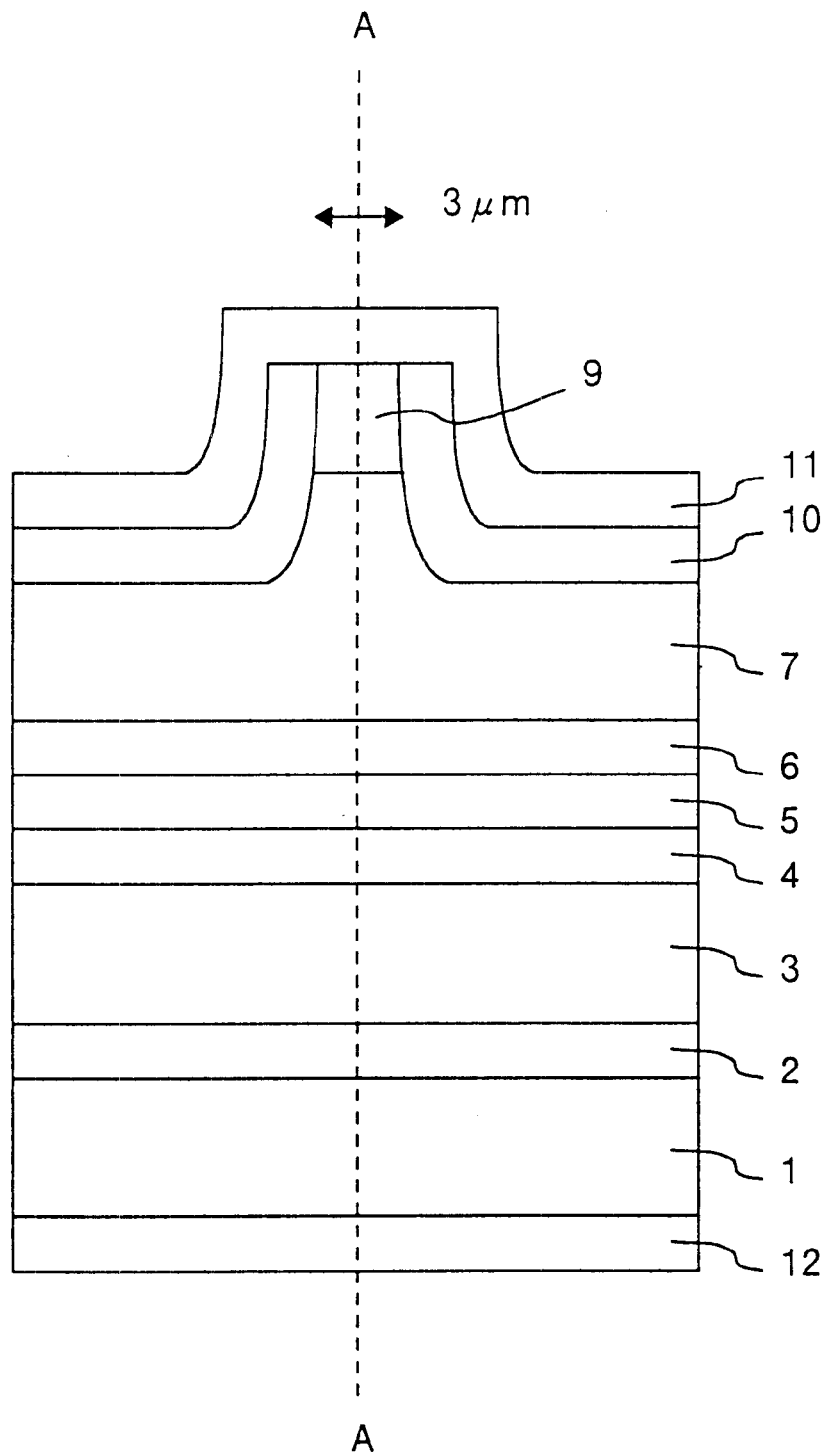
FIG. 9 shows a cross section of a conventional semiconductor laser element.
Figure 10:
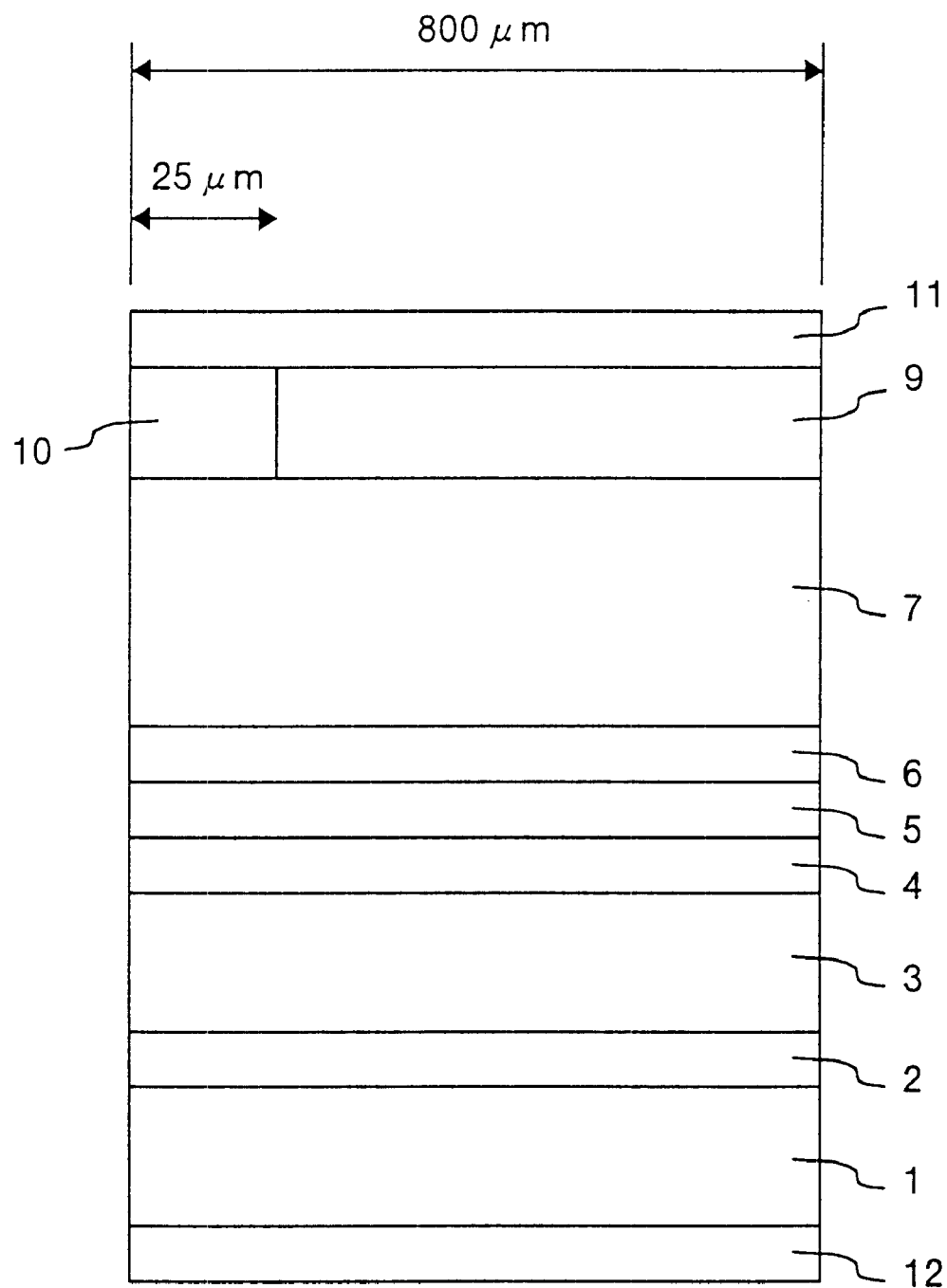
FIG. 10 shows a cross section of the semiconductor laser element shown in FIG. 9 along the line A—A.

Then, as shown in FIG. 8D, the p-electrode 11 is formed in the manner as already explained in the first embodiment. Similarly, although not shown in this figure, the n-electrode 12 is also formed in the manner as already explained in the first embodiment. Finally, a coating of an anti-reflection film is created on the laser-emission side end facet F1, and a coating of optical reflection film is created on the laser-reflection side end facet F2 in the manner as already explained in the first embodiment.

The etchant T1 explained in the first embodiment is used for selectively etching the cap layer 9 and resistance control layer 8. The p-$Al_{0.15}Ga_{0.65}As$ resistance control layer 8 was completely removed in this etching.

According to the third embodiment, the current non-injection structure is formed by forming insulating SiN films 32a and 32b of thickness 120 nm that cover the layers exposed in the selective etching. As a result, the current non-injection structures can be surely formed with simple method.

The third embodiment explained a case in which the cap layer 9 and resistance control layer 8 in the vicinity of both the laser-emission side end facet F1 and the laser-reflection side end facet F2 were etched and insulating SiN films were formed in the vicinity of both the laser-emission side end facet F1 and the laser-reflection side end facet F2. However, the cap layer 9 and resistance control layer 8 near only the laser-emission side end facet F1 may be etched and an insulating SiN film may be formed near only the laser-emission side end facet F1.

Moreover, the third embodiment explained a case in which the insulating films that cover the layers exposed in the selective etching is made of SiN. However, the insulating films may be made of $SiO_2$ or $Al_2O_3$.

Furthermore, the third embodiment explained a case in which the etchant T1 is used to selectively etch the cap layer 9 and resistance control layer 8. However, the etchants T2, T2, and T4 may be used.

Furthermore, it is mentioned in the first to third embodiments that the semiconductor laser element has a ridge mesa. However, the semiconductor laser element need not be limited to the one having a ridge mesa. When there exist a lamination comprising in order the p-$Al_xGa_{1-x}As$, p-$Al_yGa_{1-y}As$ (where x>y>0.2) and p-GaAs layers, then the present invention can be applied to selectively etch the p-$Al_yGa_{1-y}As$ and p-GaAs layers.

Furthermore, it is mentioned in the first to third embodiments that the organic acid is citric acid. However, the organic acid could be any organic acid such as malic acid, malonic acid, oxalic acid, tartaric acid.

Furthermore, it is mentioned in the first to third embodiments that the width of the etched portion from the end facet is 25 µm. However, this width may be 10 µm or more. When the width is less than 10 µm the current non-injection region does not give proper effect.

Figure 4:
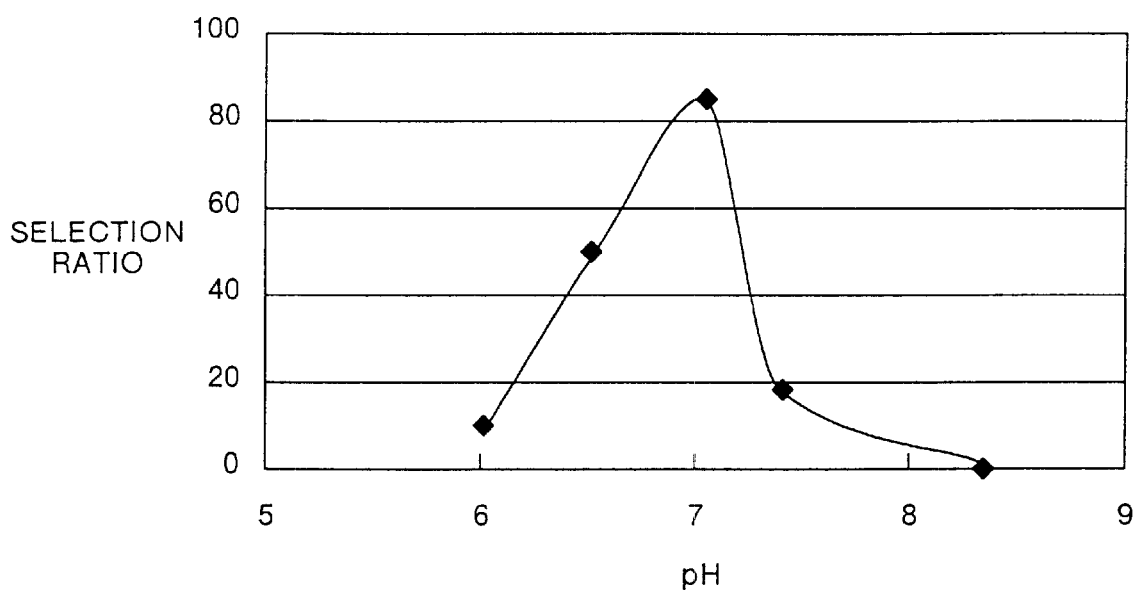
FIG. 4 is a graph that shows a relation between the pH of etchant and the selection ratio.

Furthermore, it is confirmed with experiments that the curve shown in FIG. 4 is obtained when the volume ratio of the aqueous organic acid solution to aqueous hydrogen peroxide solution is between 1:1 and 200:1. Thus, although specific figure of the volume ratio of these two solutions have been mentioned in the first to third embodiments, the volume ration could be any value between 1:1 and 200:1.

As explained above, according to the semiconductor laser element of one aspect of this invention, desired layers can be completely etched without harming other layers. Furthermore, an insulating layer which has substantially the same thickness as the thickness of the etched layers is formed in the portion from where the layers are etched. As a result, the current non-injection structure can be formed, and it becomes possible to decrease the intensity of light only near side end facet. The layers may be etched only near the laser-emission side end facet, or may be etched in the vicinity of both the laser-emission side end facet and the laser-reflection side end facet.

According to the semiconductor laser element of another aspect of this invention, desired layers can be completely etched without harming other layers. Furthermore, an insulating layer which covers only the surfaces of the layers that were exposed due to the etching is formed. As a result, the current non-injection structure can be formed, and it becomes possible to decrease the intensity of light only near side end facet. The layers may be etched only near the laser-emission side end facet, or may be etched near both the laser-emission side end facet and the laser-reflection side end facet.

According to the etchant of still another aspect of this invention, the ratio of dissolution rate of the first semiconductor layer to the third semiconductor layer is between 10 and 20. As a result, the second semiconductor layer can be removed completely.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor laser element having a laser-emission side end facet, comprising:
   a semiconductor substrate;
   a clad layer stacked directly above said semiconductor substrate or above some other layer stacked above said semiconductor substrate;
   a resistance control layer stacked above said clad layer and which controls a junction resistance between said clad layer and a cap layer stacked above said resistance control layer;
   said cap layer has a shape such that it narrows an electric current flowing in active layers; wherein
      a portion of said cap layer and said resistance control layer in the vicinity of said laser-emission side end facet is removed by selective etching, and
      an insulating layer having a thickness which is the same as the total thickness of said cap layer and said resistance control layer is formed in the portion that became hollow due to etching; and
   a top electrode layer stacked above said cap layer and said insulating layer.

2. The semiconductor laser element according to claim 1, wherein said semiconductor laser element having a laser-reflection side end facet, and
   a portion of said cap layer and said resistance control layer in the vicinity of said laser-reflection side end facet is removed by selective etching, and
   an insulating layer having a thickness which is the same as the total thickness of said cap layer and said resistance control layer is formed in the portion that became hollow due to etching.

3. The semiconductor laser element according to claim 1, wherein said insulating layer is made of SiN, $SiO_2$, or $Al_2O_3$.

4. The semiconductor laser element according to claim 1, wherein the width from said laser-reflection side end facet of the etched portion of said cap layer and said resistance control layer is 10 $\mu$m or more.

5. The semiconductor laser element according to claim 1, further comprising a bottom electrode layer stacked below said semiconductor substrate.

6. A semiconductor laser element having a laser-emission side end facet, comprising:
   a semiconductor substrate;
   a clad layer stacked directly above said semiconductor substrate or above some other layer stacked above said semiconductor substrate;
   a resistance control layer stacked above said clad layer and which controls a junction resistance between said clad layer and a cap layer stacked above said resistance control layer;
   said cap layer has a shape such that it narrows an electric current flowing in active layers; wherein
      a portion of said cap layer and said resistance control layer in the vicinity of said laser-emission side end facet is removed by selective etching, and
      an insulating film which covers the surface of said clad layer exposed due to the etching, side faces of said resistance control layer and said cap layer, and a portion of top surface of said cap layer; and
   a top electrode layer stacked above said cap layer and said insulating film.

7. The semiconductor laser element according to claim 6, wherein said semiconductor laser element having a laser-reflection side end facet, and
   a portion of said cap layer and said resistance control layer in the vicinity of said laser-reflection side end facet is removed by selective etching, and
   an insulating film which covers the surface of said clad layer exposed due to the etching, side faces of said resistance control layer and said cap layer, and a portion of top surface of said cap layer.

8. The semiconductor laser element according to claim 6, wherein said insulating film is made of SiN, $SiO_2$, or $Al_2O_3$.

9. The semiconductor laser element according to claim 6, wherein the width from said laser-reflection side end facet of the etched portion of said cap layer and said resistance control layer is 10 $\mu$m or more.

10. The semiconductor laser element according to claim 6, further comprising a bottom electrode layer stacked below said semiconductor substrate.

11. The semiconductor laser element according to claim 6, wherein thickness of said insulating film is 100 nm or more.

12. An etchant for selectively etching only a first and second layers of a multilayered semiconductor laser element comprising at least a third layer and said second and first layers stacked successively on a semiconductor substrate, wherein said second layer controls resistance of said multilayered semiconductor laser element, wherein
   said etchant has such a composition that the ratio of dissolution rate of said first semiconductor layer to said third semiconductor layer is between 10 and 20.

13. The etchant according to claim 12, wherein said first layer is made of p-GaAs, said second layer is made of p-$Al_yGa_{1-y}As$, said third layer is made of p-$Al_xGa_{1-x}As$ where x>y>0.2.

14. The etchant according to claim 12, wherein said etchant is a mixture of organic acid and hydrogen peroxide based mixture.

15. The etchant according to claim 12, wherein the pH of said etchant is between 7.4 and 7.8.

16. A method of fabricating a semiconductor laser element, said semiconductor laser element having a laser-emission side end facet, the method comprising the steps of:
   stacking a semiconductor substrate;
   stacking a clad layer directly above said semiconductor substrate or above some other layer stacked above said semiconductor substrate;
   stacking a resistance control layer above said clad layer which controls a junction resistance between said clad layer and a cap layer stacked above said resistance control layer, said cap layer has a shape such that it narrows an electric current flowing in active layers;

selective etching a portion of said cap layer and said resistance control layer in the vicinity of said laser-emission side end facet;

stacking an insulating layer having a thickness which is the same as the total thickness of said cap layer and said resistance control layer in the portion that became hollow due to etching; and stacking a top electrode layer above said cap layer and said insulating layer.

17. The method according to claim 16, wherein said semiconductor laser element having a laser-reflection side end facet, the method further comprising the step of:

selective etching a portion of said cap layer and said resistance control layer in the vicinity of said laser-reflection side end facet; and stacking an insulating layer having a thickness which is the same as the total thickness of said cap layer and said resistance control layer is formed in the portion that became hollow due to etching.

18. The method according to claim 17, wherein the pH of said etchant is between 7.4 and 7.8.

19. The method according to claim 17, further comprising step of stacking a bottom electrode layer below said semiconductor substrate.

20. The method according to claim 16, wherein the selective etching of said cap layer and said resistance control layer is carried using an etchant for which ratio of dissolution rates of said clad layer to said cap layer is between 10 and 20.

21. The method according to claim 16, wherein said insulating layer is made of SiN, $SiO_2$, or $Al_2O_3$.

22. The method according to claim 16, wherein the width from said laser-reflection side end facet of the etched portion of said cap layer and said resistance control layer is 10 $\mu$m or more.

23. The method according to claim 16, wherein said clad layer is made of p-GaAs, said resistance control layer is made of p-$Al_yGa_{1-y}As$, said cap layer is made of p-$Al_xGa_{1-x}As$ where x>y>0.2.

24. The method according to claim 16, wherein said etchant is a mixture of organic acid and hydrogen peroxide based mixture.

25. A method of fabricating a semiconductor laser element, said semiconductor laser element having a laser-emission side end facet, the method comprising the steps of:

stacking a semiconductor substrate;

stacking a clad layer directly above said semiconductor substrate or above some other layer stacked above said semiconductor substrate;

stacking a resistance control layer above said clad layer which controls a junction resistance between said clad layer and a cap layer stacked above said resistance control layer, said cap layer has a shape such that it narrows an electric current flowing in active layers;

selective etching a portion of said cap layer and said resistance control layer in the vicinity of said laser-emission side end facet;

stacking an insulating film which covers the surface of said clad layer exposed due to the etching, side faces of said resistance control layer and said cap layer, and a portion of top surface of said cap layer; and stacking a top electrode layer above said cap layer and said insulating film.

26. The method according to claim 25, wherein said semiconductor laser element having laser-reflection side end facet, the method further comprising the step of:

selective etching a portion of said cap layer and said resistance control layer in the vicinity of said laser-reflection side end facet; and stacking an insulating film having a thickness which is the same as the total thickness of said cap layer and said resistance control layer is formed in the portion that became hollow due to etching.

27. The method according to claim 25, wherein the selective etching of said cap layer and said resistance control layer is carried using an etchant for which ratio of dissolution rates of said clad layer to said cap layer is between 10 and 20.

28. The method according to claim 25, wherein said insulating film is made of SiN, $SiO_2$, or $Al_2O_3$.

29. The method according to claim 25, wherein the width from said laser-reflection side end facet of the etched portion of said cap layer and said resistance control layer is 10 $\mu$m or more.

30. The method according to claim 25, wherein said clad layer is made of p-GaAs, said resistance control layer is made of p-$Al_yGa_{1-y}As$, said cap layer is made of p-$Al_xGa_{1-x}As$ where x>y>0.2.

31. The method according to claim 25, wherein said etchant is a mixture of organic acid and hydrogen peroxide based mixture.

32. The method according to claim 25, wherein the pH of said etchant is between 7.4 and 7.8.

33. The method according to claim 25, further comprising step of stacking a bottom electrode layer below said semiconductor substrate.

34. The method according to claim 25, wherein thickness of said insulating film is 100 nm or more.

* * * * *